United States Patent [19]

Pollock et al.

[11] Patent Number: 4,982,068
[45] Date of Patent: Jan. 1, 1991

[54] FLUID PERMEABLE POROUS ELECTRIC HEATING ELEMENT

[75] Inventors: James F. Pollock, Hock; John M. North, Near Newbury; Roy F. Preston, Abingdon; Vincent K. Hewinson, Boston, all of England

[73] Assignee: United Kingdom Atomic Energy Authority, London, Great Britain

[21] Appl. No.: 442,896

[22] Filed: Nov. 28, 1989

Related U.S. Application Data

[63] Continuation of Ser. No. 23,498, Mar. 9, 1987, abandoned, which is a continuation of Ser. No. 686,736, Dec. 27, 1984, abandoned, which is a continuation of Ser. No. 330,827, Dec. 15, 1981, abandoned, which is a continuation-in-part of Ser. No. 150,187, Jun. 13, 1980, abandoned.

[30] Foreign Application Priority Data

Jun. 14, 1979 [GB] United Kingdom ............... 792066

[51] Int. Cl.⁵ .................................................. H05B 3/14
[52] U.S. Cl. ...................................... 392/488; 427/122; 427/227; 427/296; 427/444; 428/376; 428/398; 392/492
[58] Field of Search ............................. 219/380–382, 219/365, 374, 308, 332, 543; 165/65; 338/308, 332; 568/959; 427/40, 122, 227–229, 296, 444; 428/367, 376, 398

[56] References Cited

U.S. PATENT DOCUMENTS

| | | | |
|---|---|---|---|
| 3,335,049 | 8/1967 | Pultz | 428/367 |
| 3,390,452 | 7/1968 | Huang | 338/308 |
| 3,622,369 | 11/1971 | Basche et al. | 428/391 |
| 3,682,686 | 8/1972 | Nakamura et al. | 427/228 |
| 3,700,827 | 10/1972 | Brandes et al. | 219/543 |
| 3,720,536 | 3/1973 | Scola et al. | 427/444 |
| 3,811,927 | 5/1974 | Joo et al. | 428/367 |
| 3,927,186 | 12/1975 | Vinton et al. | 427/227 |
| 3,934,117 | 1/1976 | Schladitz | 219/382 |
| 4,009,305 | 2/1977 | Fujimaki et al. | 427/444 |
| 4,019,021 | 4/1977 | Schladitz | 219/381 |
| 4,061,827 | 12/1977 | Gould | 427/122 |
| 4,140,266 | 2/1979 | Wagner | 165/65 |
| 4,212,933 | 7/1980 | Markin et al. | 427/122 |
| 4,220,846 | 9/1980 | Rize et al. | 219/381 |
| 4,257,157 | 3/1981 | Pollock et al. | 219/381 |

FOREIGN PATENT DOCUMENTS

2364654  6/1975  Fed. Rep. of Germany .
2822536  1/1979  Fed. Rep. of Germany .
1317726  5/1973  Japan .

(List continued on next page.)

OTHER PUBLICATIONS

"Codeposition of Glassy Silica and Germania Inside a Tube by Plasma Activated CUD", by Kuppers et al., pp. 1079–1083, 07/1976.
"Preparation of Ceramic Films by Plasma Activated Vapour Deposition (PAVD)", Linger, Proceedings of Conference on Ion Plating and Allied Techniques, pp. 223–229, 06/1977, CEP Consultants Ltd.

Primary Examiner—Geoffrey S. Evans
Attorney, Agent, or Firm—William R. Hinds

[57] ABSTRACT

A heating element comprises a body provided by fibrous tubes of an electrically conductive material, a voidage between the tubes providing a path for a fluid to be heated. The material may be silicon, silicon carbide, or silicon rich-silicon nitride. The heating element is manufactured by coating a fibrous carbon precursor with the material, and heating the coated precursor in an oxidizing environment so as to remove the carbon precursor by oxidation. The heating element has one application for a heat transfer system for controlling the temperature of a hot working device. The system comprises a fluid circuit including the hot working device, the heating element through which the fluid is driven by a pump, and a temperature controller for sensing the temperature of the device and controlling the temperature of the heating element as a function of the device temperature.

7 Claims, 6 Drawing Sheets

FOREIGN PATENT DOCUMENTS

| | | |
|---|---|---|
| 52-6714 | 1/1977 | Japan . |
| 1463164 | 2/1977 | Japan . |
| 8000334 | 3/1980 | PCT Int'l Appl. ................ 219/381 |
| 670341 | 6/1979 | U.S.S.R. ................................ 165/65 |
| 440762 | 1/1936 | United Kingdom . |
| 1096375 | 12/1967 | United Kingdom . |
| 1283352 | 7/1972 | United Kingdom . |
| 1286815 | 8/1972 | United Kingdom . |
| 1325675 | 8/1973 | United Kingdom . |
| 1355987 | 6/1974 | United Kingdom . |
| 1402013 | 8/1975 | United Kingdom . |
| 1415042 | 11/1975 | United Kingdom . |
| 1444461 | 7/1976 | United Kingdom . |
| 1455911 | 11/1976 | United Kingdom . |
| 1466240 | 3/1977 | United Kingdom . |
| 1476327 | 6/1977 | United Kingdom . |
| 1503644 | 3/1978 | United Kingdom . |
| 1514171 | 6/1978 | United Kingdom . |

FLUID PERMEABLE POROUS ELECTRIC HEATING ELEMENT

REFERENCE TO RELATED APPLICATIONS

This application is a continuation of application Ser. No. 023,498 filed Mar. 9, 1987, which is a continuation of application Ser. No. 686,736 filed Dec. 27, 1984, which is a continuation of application Ser. No. 330,827 filed Dec. 15, 1981, which is a continuation-in-part of application Ser. No. 159,187 filed June 13, 1980, all of said earlier applications being abandoned.

BACKGROUND, FIELD, AND FEATURES AND ASPECTS OF THE INVENTION

This invention relates to a fluid permeable, fibrous electric heating element for example for a heat transfer system and to said system, and includes a heat transfer system for controlling the temperature of a mould, a calender, or an extruder.

The invention also provides a process for manufacturing a fluid permeable, fibrous electric heating element comprising an electrically conductive selected material, the process comprising, the steps of, forming a precursor comprising carbon fibres, coating the fibres of the precursor with the selected material by a vapor deposition process, and then heating the coated precursor in an oxidizing environment at a temperature between 300° C. and 1400° C. such as to remove the fibrous carbon precursor by oxidation thereof and leave a fibrous body comprising hollow tubular fibers comprising the selected material, the tubular fibers defining a voidage between adjacent said tubular fibers in the body, and the voidage providing a path for a fluid to be heated, and heating the coated precursor at a temperature between 650° C. and 1400° C. to modify the structure of the coating and to lower the electrical resistivity of the coating to a desired value, the two heating steps being performed in either order or as a single step.

Preferably, the coating is produced from a plasma formed by the ionisation in an electrical field, such as a radio frequency field, of a gas or gases containing chemical elements of the selected material to be deposited.

The invention also provides a fluid permeable, fibrous electric heating element made by the process of the invention. A desired electrical resistance of the heating element may be obtained by an appropriate heat treatment which might be the oxidising step of said process, or a prior or a subsequent heat treatment.

The heating element made by the process of the invention comprises a fibrous body comprising electrically conductive tubular fibers comprising the selected material, the tubular fibers defining a voidage between adjacent said tubular fibers in the body, and the voidage providing a path for a fluid to be heated. The tubular fibers may comprise a silicon-containing material, for example silicon, silicon carbide, or silicon nitride, or silicon and carbon together with silicon carbide, or silicon together with silicon carbide, or silicon together with silicon nitride.

The heating element of the invention may be used for example in a heat transfer system comprising a circuit adapted to contain a fluid, a heating means for heating the fluid in the circuit, and a heat transfer surface portion, the heating means comprising a fluid permeable, porous electric heating element of the invention in series with at least a part of the circuit. The heat transfer surface portion may comprise a portion of a device for heating a material such for example as, a plastics material, a metal, paper, a textile, or a chemical substance.

Examples of porous electric heating elements are described in British patent specification Nos. 1466240 (U.S. Pat. No. 3,943,330), 1503644, and 1600253 (U.S. Pat. No. 4,257,157), these Specifications and Patents being incorporated by reference herein.

It is frequently necessary to heat a fluid, either a gas or a liquid, electrically and to utilise a closed loop fluid circulating system to transfer this heat to other fluids or plant in a heat exchange system. A particular example is the use of a heated liquid (e.g. oil or water) for the purpose of controlling the temperature of moulds, dies, extruders and calenders used in the plastics industry. In existing designs of such temperature control units immersion electric elements of the metal sheathed type have been used, the heat generated in these elements being transferred by conduction through the metal sheath wall to the surrounding liquid which flows past the element. There is a limit to the heat transfer coefficient which can be used with this type of element if oil breakdown or element burnout is to be avoided, e.g. 1–20 watts cm$^2$ of the element surface area. This factor exerts a consequent effect on the metal sheath size, and the size and weight of the heating system especially at high power ratings.

Furthermore, the response of such units to a requirement for a change in the rate of heat transfer to the fluid is comparatively slow due to the appreciable heat capacity of the heating element itself, to the need to limit the element centre temperature to avoid melting the electrical conductor, and to the need to avoid high surface temperatures of the element sheath. This slow response can have a controlling influence on production cycle times when such temperature control units are used to heat moulds and dies in a production run of identical components.

The invention largely overcomes these limitations by removing the sheathed metal element and replacing it with a fluid permeable fibrous electric heating element, and circulating the fluid through the body of the permeable heating element instead of over the external surface only. Power densities exceeding 1 kW/cm$^3$ of heating element material can then be attained, and this leads not only to a reduction in size and weight of a heating unit for a given duty but also a decrease in the response time such that the system can react virtually instantaneously to a demand for a large step increase in the heat generated and transferred to the circulating fluid.

A suitable permeable heating element might comprise silicon, silicon carbide, or a mixture of silicon and silicon carbide, or silicon, carbon and silicon carbide, of a voidage of 50–98% and a bulk density of 50–750 Kg/m$^3$, in which the individual heating elements consist of a matrix of fine or tubular fibres of a diameter in the range 5–300 microns, the space between the fibers providing the voidage. A thermal barrier/dispenser may be used in conjunction with the heating element to produce a uniform fluid flow (See U.K. Patent No. 1 466 240), especially where there is a hydrostatic pressure head variation over the heating element entry surface.

It may be desirable to maintain a heat generation rate and a fluid flow rate through the voidage in the heating element which restricts the fluid temperature rise across the heating element to not more than about 50° C., but this is not essential and temperature rises of 2°–300° C.

or more are possible with a heating element wall thickness of 2-15 mm for an annular heating element. The heating element may have a predetermined electrical resistivity at a particular temperature, and a particular temperature coefficient of resistance, and may be suitable for mains voltage operation without the need for a transformer.

The system components include a circulating pump, a heating element assembly, valves and pipework with the oil passing in series through the element and the mould, die, extruder, or calender to be heated together with a control system. Such units have been devised and operated at heating element power ratings in the range 1-30 kW for the aforementioned heating element geometry and with a response time of a few seconds. Very compact units can be designed and for the high power units, the small size which is attainable by the use of a high heating element power density rating reduces the cost of construction considerably compared with conventional heat transfer systems.

BRIEF DESCRIPTION OF THE DRAWINGS

The invention will now be further described by way of example only with reference to the accompanying drawings in which:

FIG. 4a shows a fragmentary sectional view of the line IVa—IVa of FIG. 4;

DESCRIPTION OF PREFERRED EMBODIMENTS

Figure 1:
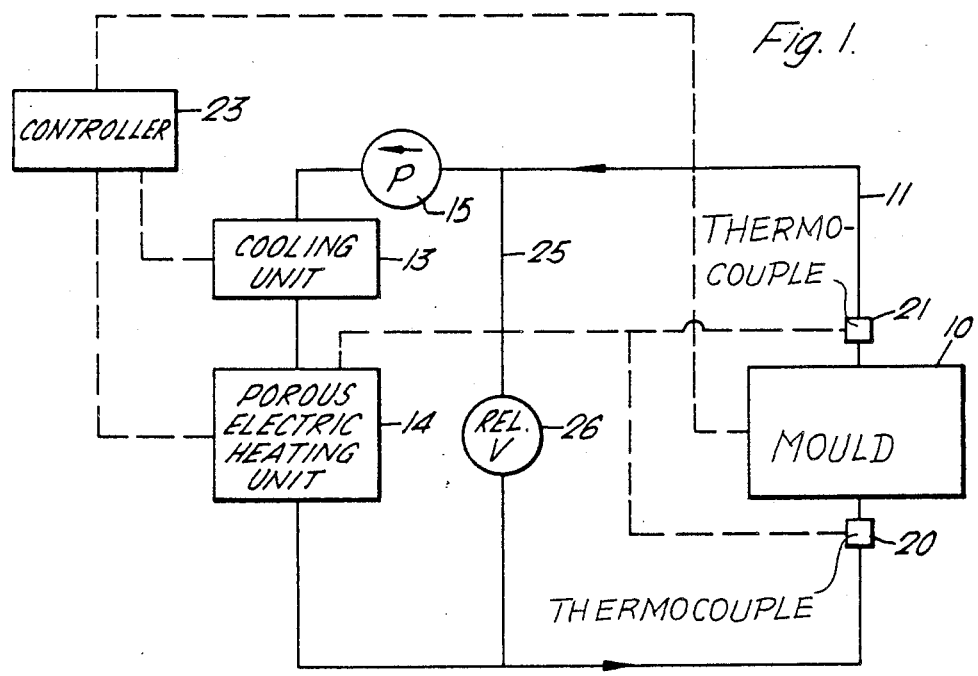
FIG. 1 shows a schematic representation of a heat transfer system for heating a mould.

Referring now to FIG. 1, the heat transfer system essentially comprises a mould 10 (e.g. an injection mould) connected by piping 11 to a cooling unit 13 and to a permeable element electric heating unit 14. A heat transfer oil in the piping 11, such as British Petroleum (BP) Transcal N, is arranged to be circulated around the system by a pump 15. An inlet thermocouple 20 and an outlet thermocouple 21 are located about the mould 10 to sense the temperature of the oil in the piping 11, and a mould temperature controller 23 senses the temperature of the mould 10 and controls the operation of the cooling unit 13 and the heating unit 14 to maintain the mould 10 at a desired temperature. A by-pass limb 25 having a relief valve 26 is connected to the piping 11 in parallel with the mould 10.

Figure 2:
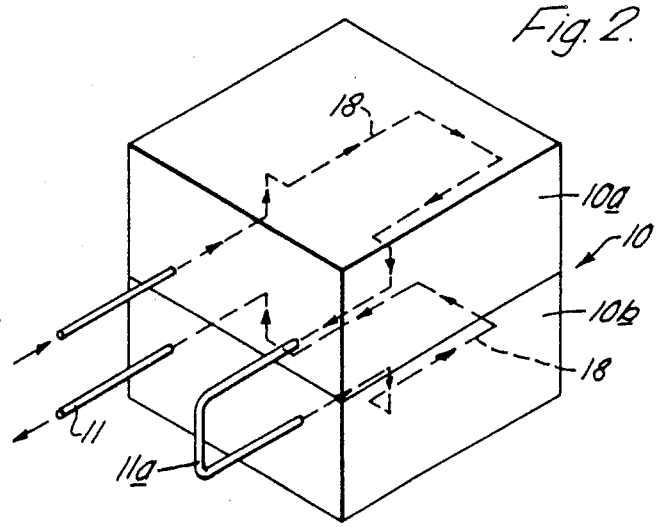
FIG. 2 shows to an enlarged scale a perspective representation of the mould used in the system of FIG. 1.
Figure 3:
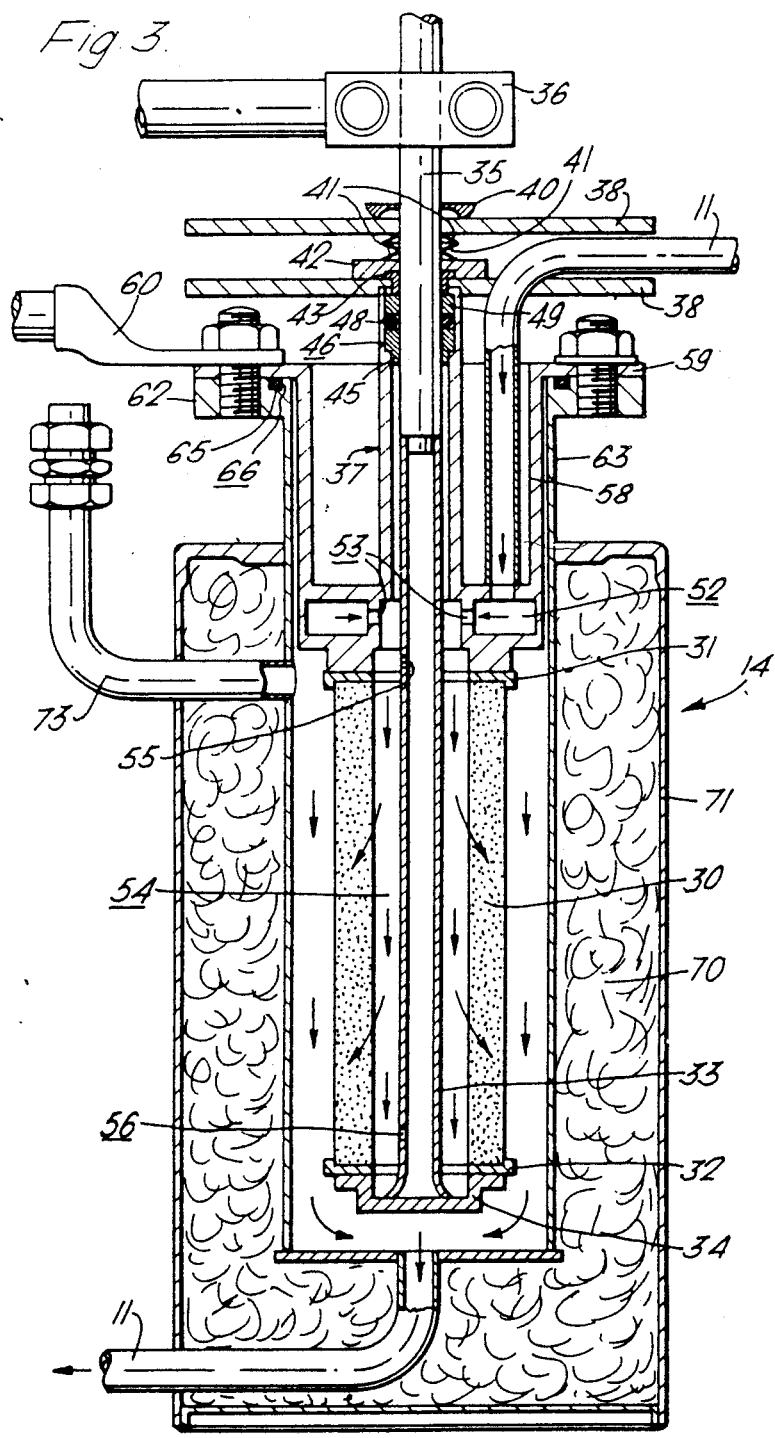
FIG. 3 shows a medial section and to an enlarged scale, a side view of an electric heating unit for use in the system of the invention.

The mould 10 as shown in greater detail in FIG. 2 to which reference is made, is in two half-portions 10a and 10b respectively and has oil ducts 18 in series with the piping 11 for the circulation of the oil through the mould 10, and a connecting pipe 11a which may be flexible to factilitate separation and closure of the two half-portions 10a, 10b, for connecting the oil ducts 18 between the half-portions 10a, 10b, Referring now to FIG. 3, the permeable element electric heating unit 14 is generally of circular form in transverse section, and comprises a fluid permeable fibrous heating element 30 of hollow cylindrical form, for example 120 mm long, and having gold plated copper electrodes 31 and 32 at the upper and at the lower ends of the heating element 30 respectively. The lower electrode 32 is joined to a brass end cap 34 that is joined to a steel tube 33 brazed to a copper rod 35 which is connected by a clamp-type terminal 36 to an electric supply (not shown). Two metal cooling discs 38 are disposed about the rod 35 and are held by a "Starlock" retaining washer 40 located above the uppermost cooling disc 38, three Schnorr washers 41 between the cooling discs 38 maintaining a compressive force on a pad 42 which is arranged to bear on a shouldered collar 43 of an electrical insulating material. A shouldered insert 45 of an electrical insulating material such as polyamide Tufnol locates in a recess 46 in a housing 37 and supports an 'O' ring seal 48 disposed around the rod 35, a flat annular upper spacer 49 of the same material as that of the shouldered insert 45 being urged against the 'O' ring seal 48 by the shouldered collar 43.

The housing 37 which is joined to the upper electrode 31 has an inner chamber 52 connected to the piping 11 and inlet ports 53 (only two are shown) connecting the inner chamber 52 to a space 54 between the inside surface of the heating element 30 and the outside surface of the tube 33, the 33 having an upper-port 55 and a lower port 56 connecting the bore of the tube 33 with the space 54 and acts as a thermal dispenser.

The housing 37 has a tube portion 58 with an external flange 59 which is clamped to an external flange 62 of a tubular inner casing 63 in which the heating element 30 is disposed, an 'O' ring seal 65 being provided in an annular recess 66 and an earth terminal 60 attached to the flange 62.

A thermal insulant such as Kaowool is arranged as a lagging 70 between the inner casing 63 and an outer casing 71, the piping 11 extending through the lower portion of the outer casing 71 and the lagging 70 to the lower end of the inner casing 63, and an air bleed pipe 73 extending through the upper portion of the outer casing 71 and the lagging 70 to the inner casing 63.

In use of the mould 10 for the forming of plastics articles (not shown), the mould 10 is held at a desired operating temperature by the oil circulated through the mould 10 by the pump 15. The temperature controller 23 senses the temperature of the mould 10 and adjusts as appropriate either the rate of flow of a coolant (e.g. water) through the cooling unit 13 or the flow of the current to the porous electric heating unit 14 so as to control the temperature of the oil and thus maintain the mould 10 at the required operating temperature. The oil temperature thermocouples 20, 21 provide an additional monitoring capacity and can actuate the heating unit 14 at some predetermined oil temperature or temperature difference of the oil across the mould 10.

In an alternative arrangement, the oil may flow through the heating unit 14 in the reverse direction to that shown.

Figure 4:
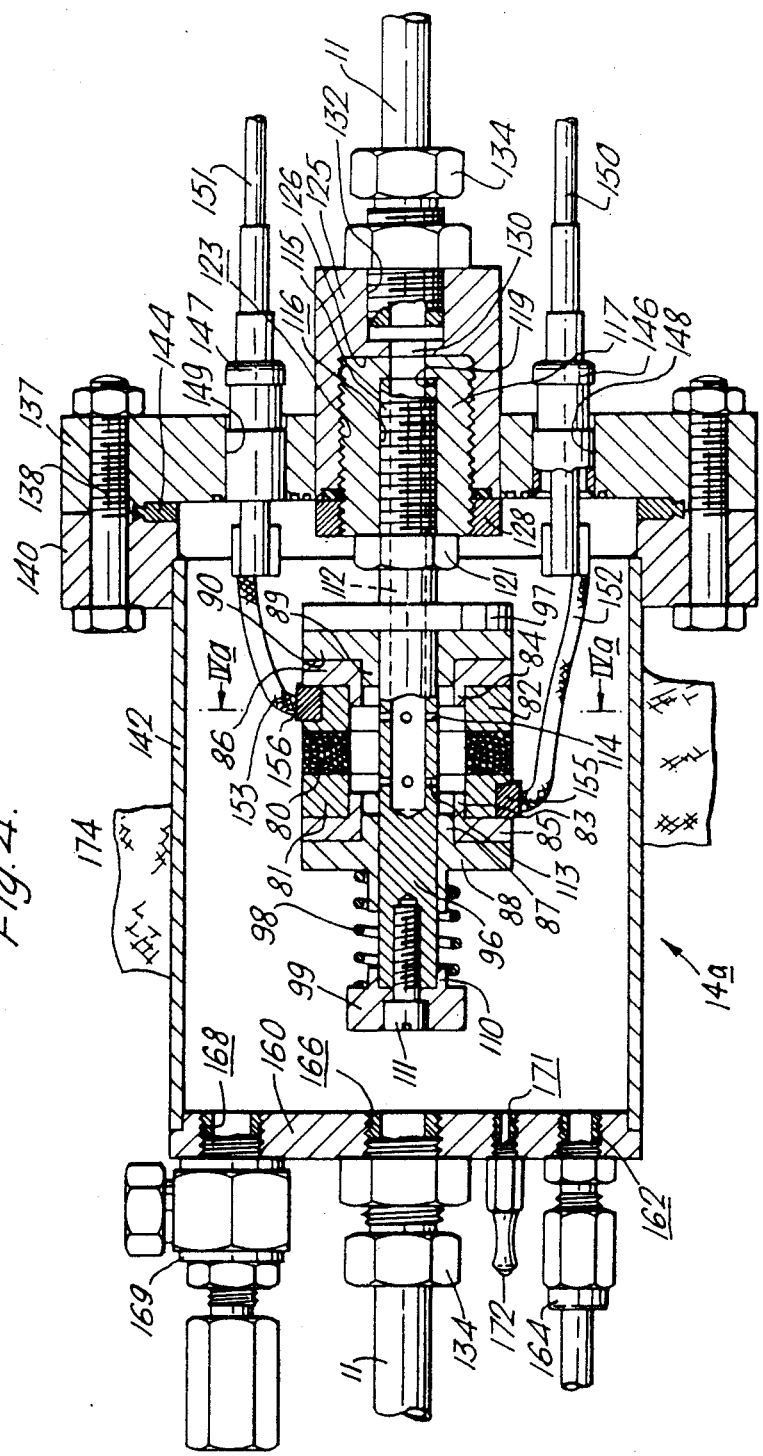
FIG. 4 shows in medial section and to an enlarged scale, a side view of an alternative electric heating unit.

A shorter heating element 30 may be used in the heating unit 14, to overcome the problem of non-uniform flow which arises with long heating elements 30 as a result of hydrostatic pressure differences along the heating element 30, and to increase the fluid velocity through the heating element 30 so that a high power generation density may be employed. An example of such a compact heating element is shown in FIG. 4 in which an electric heating unit 14a incorporates a fluid permeable fibrous heating element 80 of hollow cylindrical form and typically about 45 mm outside diameter, 35 mm inside diameter, and 10 mm long. Gold plated annular copper electrodes 81 and 82 are disposed at respective ends of the heating element 80, and each electrode 81, 82 is supported on a boss 83, 84 from a respective stainless steel annular backing disc 85 or 86. The backing disc 85 is supported on a boss 87 from an annular electrical insulator 88 of polyamide TUFNOL, and the backing disc 86 is similarly supported on a boss 89 from an annular insulator 90 of polyamide TUFNOL. Thin gaskets (not shown) of a deformable material such as graphite, copper or aluminium may be provided between the ends of the element 80 and the electrodes 81 and 82.

A stainless steel dispenser rod 96 extends through and supports the insulators 88, 90, and has a circular flange 97. The insulator 90 is held against one side of the flange 97 by the action of a compression spring 98 which at one end thereof fits over a boss 110 from a cap 99. The boss 110 locates around one end of the dispenser rod 96, and the cap 99 is secured to the dispenser rod 96 by a screw 111. The other end of the spring 98 butts against the insulator 88 to press the insulators 88, 90, the electrodes 81, 82, and the insulator 90 tightly together. An axial hole 112 extends in the dispenser rod 96 from two axially spaced sets of four (only three are shown) equi-spaced radially extending outlet holes 113, 114, respectively, the axial hole 112 extending in a direction towards the other end of the dispenser rod 96.

The dispenser rod 96 at the other side of the flange 97 is screw threaded at 115, and locates inside a correspondingly threaded hole 116 in a hollow cylindrical bush 117 of polyamide TUFNOL to butt against a shoulder 119, and is held firmly in the threaded hole 116 by a stainless steel lock nut 121. The bush 117 is threaded on its outside surface to locate inside a correspondingly threaded hole 123 extending from one side of a stainless steel mounting member 125 and butts against a shoulder 126, the bush 117 being firmly held thereto by a stainless steel lock nut 128. A relatively small diameter cylindrical hole 130 at the axial centre of the shoulder 119 and the mounting member 125 leads to a threaded hole 132 at the other side of the mounting member 125 in which a compression-type pipe coupling 134 locates to connect the piping 11 to the mounting member 125. The mounting member 125 is integral with a circular flange 137 which is held by several bolts 138 (only two are shown) to an annular flange 140 of a hollow cylindrical casing 142, an annular soft copper gasket 144 providing a seal between the flanges 137, 140. Two electrodes assemblies 146, 147 respectively locate in respective holes 148, 149 in the flange 137, and are welded to the flange 137 to provides a pressure tight joint. Each electrode assembly 146, 147 provides a pressure tight, electric feedthrough from respective electric supply cables 150, 151 to respective copper braid electrical connections 152, 153 each terminating at a respective copper terminal member 155, 156 secured as shown in FIG. 4a to a shoulder 157 of the respective electrode 81 or 82. Suitable such electrode assemblies 146, 147 may be obtained for example from VG Electronics Limited, Hastings, Sussex, England, or Ferranti Limited, Hollinwood, Lancashire, England, or Friedrichsfeld GmbH, Mannbeim, West Germany, (United Kingdom Agents: Bush Beach Engineering Limited, Cheadle, Cheshire, England).

An end plate 160 closes the casing 142, and has a threaded hole 162 for a thermocouple connection 164, an axially located threaded hole 166 for another compression type pipe coupling 134 to connect the interior of the casing 142 with the piping 11, a threaded hole 168 for a hydraulic pressure valve 169, and a narrow threaded hole 171 for an automatic air relief valve 172. A thermal insulant 174 (e.g. Kaowool) surround the heating unit 14a but is shown only partially distributed thereabout for clarity.

In operation, with the heating unit 14a in place of the heating unit 14 in the heat transfer system of FIG. 1, oil flows through the piping 11 (typically at 1–10 liter/minute) and enters the axial hole 112 in the dispenser rod 96 to energe through the outlet holes 113, 114, inside the heating element 80. After flowing through the heating element 80, the oil issues into the casing 142, and leaves through the pipe coupling 134 to re-enter the piping 11 and circulate through the mould 10. With the cables 150, 151 connected to a 240 volts alternating current electric supply (not shown) a power output is provided from the heating element 80 to heat the oil to a desired temperature (e.g. 200°–300° C.). The temperature controller 23 senses the temperature of the mould 10 and switches the electric supply to the heating element 80 off and on as desired to control the temperature of the oil flowing through the heating unit 14a and thus to maintain the mould 10 at the required operating temperature. Because of the rapid speed of response of the heating element 80 when the electric supply is switched on, close control of the temperature of the mould 10 is obtained, and an example of this is shown graphically in FIG. 5 which illustrates for a heating element 80 containing silicon carbide rated at 3.4 kW at 231.5° C. a plot of temperature v time for.

(1) oil into the mould 10
(2) oil leaving the mould 10
(3) temperature of the mould 10

The magnitude of the heating unit 14 power output depends inter alia on the electric supply voltage, the electrical resistance on the heating element 80 and the number of such elements 80, and is typically in the range 1–50 kW per element.

Figure 5:
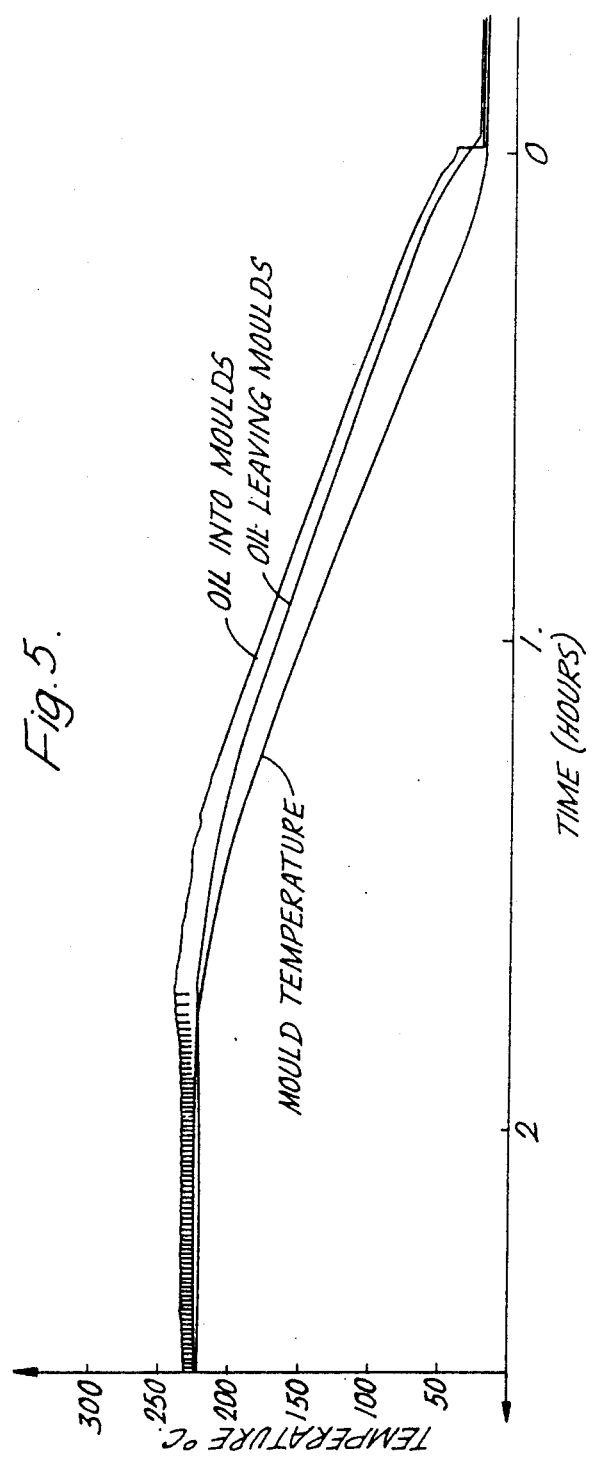
FIG. 5 shows graphical representations of temperature against time for the unit of FIG. 4.

The succession of short vertical lines relating to the temperature of the oil entering the mould 10 when a steady temperature condition is reached indicates the rapid response of the heating element 80 as the electric supply thereto is repetitively switched on and off to maintain the mould 10 at the required operating temperature, which in the case illustrated in FIG. 5 is 225° C.

If desired the oil may be arranged to flow through the heating unit 14a in the reverse direction to that shown.

The porous electric heating element may be made from a precursor in the form of a permeable fibrous carbon electric heating element comprising carbon fibres, made for example as described in the aforementioned patent Specifications, and coated with material conveniently applied by a plasma activated deposition process (PAVD). The electrical properties of this deposited material, which may be modified after deposition by appropriate heat treatments may largely detemine the electrical operating characteristics of the porous electric heating element. The permeable fibrous carbon precursor on which the material is deposited by the PAVD process may be retained, or may be removed from beneath the deposited material by means of an oxidation process.

Examples of the PAVD process are described in U.S. Pat. No. 4,212,933 (Ser. No. 908,438 filed June 22, 1978), and in "Preparation of Ceramic Films by Plasma Activated Vapour Deposition (PAVD)", by K. R. Linger, Proceedings of Conference on "Ion Plating and Allied Techniques" pp. 223-229, June 1977, published by CEP Consultants Limited, Edinburgh, these examples of PAVD being incorporated by reference herein. In PAVD a plasma is used as a medium for chemical reaction, and deposition of a coating on a substrate is achieved through the decomposition of a gas in an electrically-induced plasma. Related techniques are disclosed in the paper "Codeposition of Glassy Silica and Germania inside a Tube by Plasma Activated CVD" by D. Kuppers et al, Journal of the Electrochemical Society Vol 123 No. 7 pages 1079-1082 July 1976.

Figure 6:
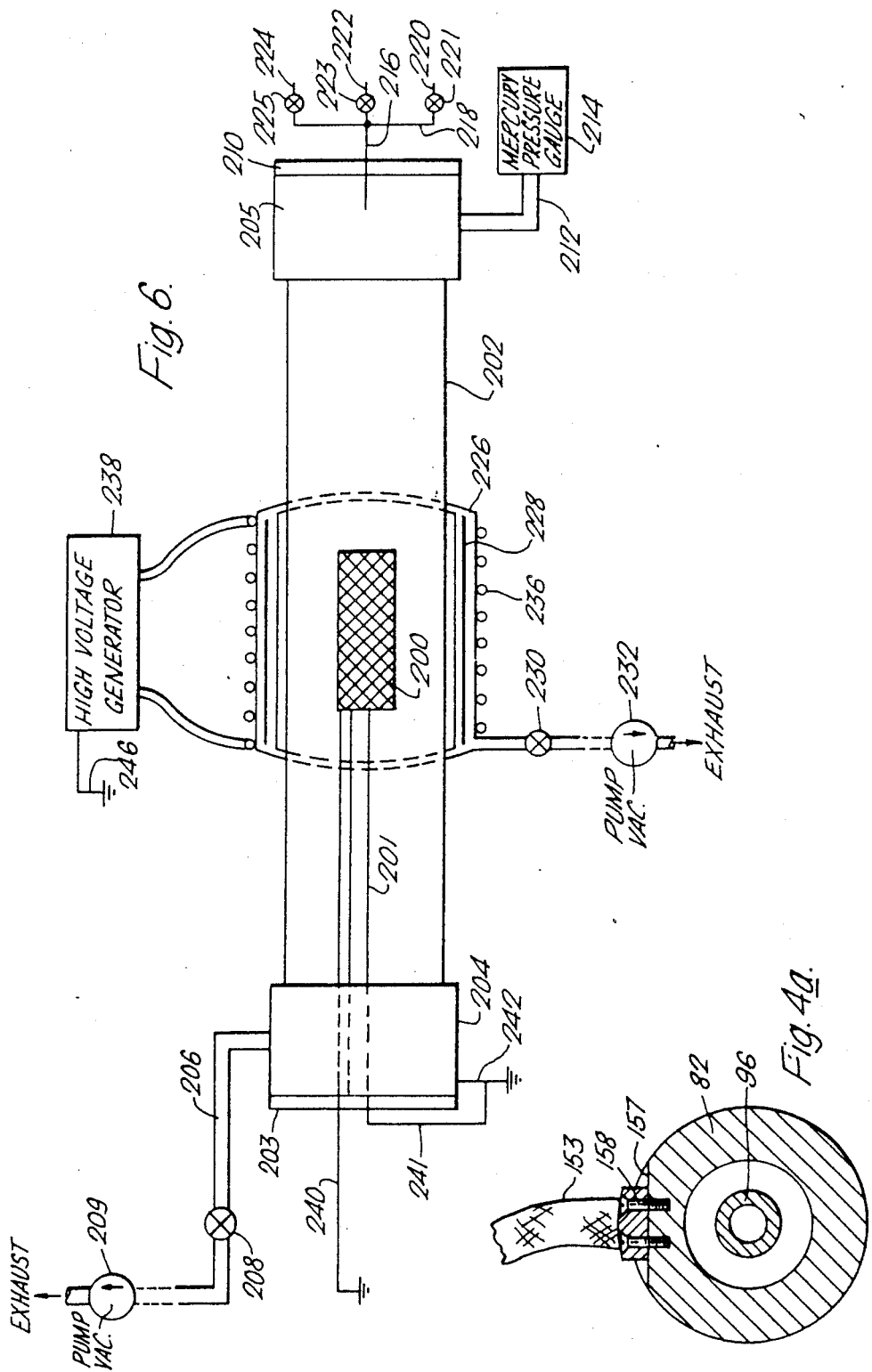
FIG. 6 shows a diagrammatic representation of a plasma activated vapour deposition apparatus.

One form of apparatus for performing the PAVD coating process is shown in FIG. 6 to which reference is now made. In FIG. 6 a fibrous carbon permeable heating element 200 is supported horizontally by an alumina tube 201 inside the central region along the bore of a cylindrical silica tube 202 having enlarged ends 204, 205, the alumina tube 201 extending axially inside the silica tube 202 from an end cap 203 which closes the enlarged end 204. An outlet pipe 206 from the enlarged end 204 is connected through a vacuum-type valve 208 to a vacuum pump 209. The other enlarged end 205 is closed by an inlet end cap 210 which has a feed pipe 212 to a mercury pressure gauge 214, and an inlet 216 connected to a manifold 218 fed by gas supply lines 220, 222, and 224 each controlled by a respective valve 221, 223, and 225. A silica vessel 226 of annular form is movable along the outside of the tube 202 and is shown surrounding the central region of the tube 202. The vessel 226 supports an electrically isolated graphite susceptor 228, and is evacuated down to about 1 to 10 Torr through a vacuum valve 230 by a vacuum pump 232. The vessel 226 is itself surrounded by a helical water-cooled copper coil 236 having eight turns and which is coupled to a high frequency power supply 238 for working in the frequency range of $10^4$-$10^8$ Hertz. Earth connections 240, 241, 242 are made to the heating element 200, the end cap 203, and the enlarged end 204 respectively. The high frequency generator 238 is similarly earthed by a connection 246. It may in some instances be advantageous to bias the connection 240 positively or negatively to earth and to connect the element 200 to the connection 240 by a metallic conductor strip (not shown).

In operation, the tube 202 is evacuated down to about $10$-$10^{-2}$ Torr by the vacuum pump 209, and then filled with argon through the gas supply line 220 to a vacuum pressure inside the tube 202 of between $10^{-2}$-100 Torr. The high frequency power supply 238 is energized typically at an anode voltage of 1-4 kV and $4 \times 10^5$ Hertz, and a plasma is created about the carbon precursor 200 whilst the susceptor 228 is heated by electrical induction and heats the carbon precursor 200. After about 15 to 30 minutes when the carbon precursor 200 has reached thermal equilibrium and its surfaces have been cleaned by ion bombardment from the ionised gaseous argon, the selected reactant gas or gases are introduced through the appropriate gas supply lines 222 and/or 224 into the tube 202, and the pressure inside the tube 202 maintained in the range $10^{-1}$ to 100 Torr by adjustment of the appropriate valve 223, 225 and use of the vacuum valve 208 and the vacuum pump 209. A coating of the selected material is now applied to the surfaces of the fibres of the carbon precursor 200 by the reactant gases, and the thickness of the material deposited is proportional to time. For example a coating of 1 to 20 $\mu$m might be deposited in about 24 hours. The valves 221, 223, and 225 are then closed, the high frequency power supply 238 switched off, whilst the tube 202 continues to be evacuated by the vacuum pump 209 to allow the coated element 200 to cool under vacuum conditions (e.g. $10^{-2}$ Torr), after which the coated precursor 200 is removed from the tube 202.

Figure 7:
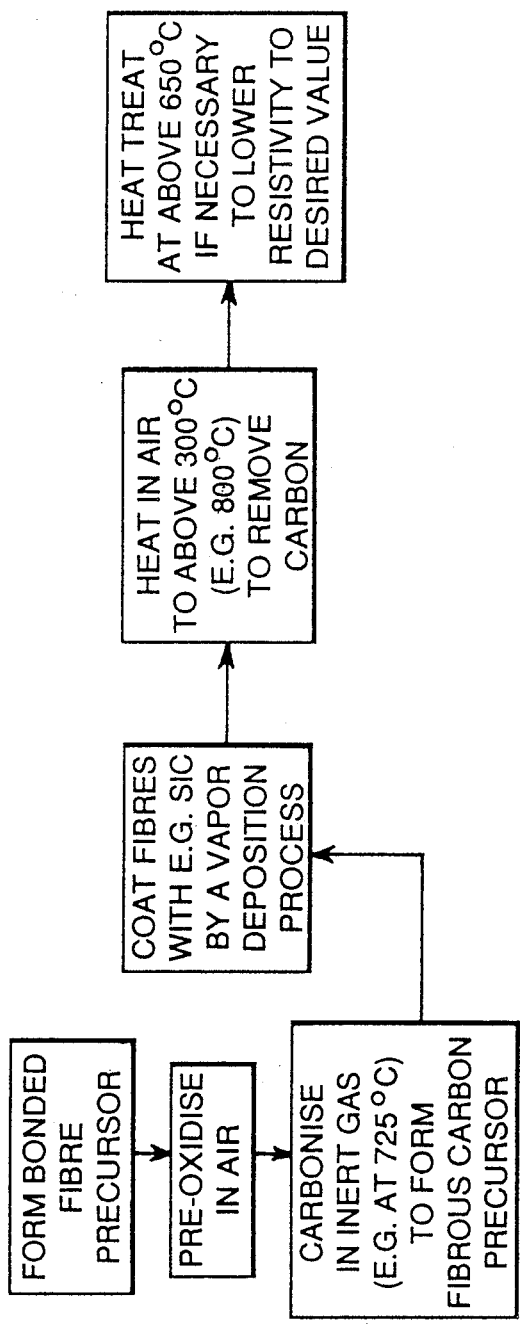
FIG. 7 shows diagrammatically the sequence of operations performed in making a heating element.

Subsequently the original fibrous carbon precursor 200 on which the coating has been deposited may either be retained, or removed by a heat treatment comprising oxidation in air at a temperature above 300° C. so that a structure of tubular fibres of the deposited material remains. A suitable heat treatment may be used to adjust the electrical conductivity and temperature coefficient of resistance of the deposited material to desired values. In cases where the fibrous carbon precursor 200 is retained, this heat treatment must be carried out in an inert environment since it would normally take place above the carbon oxidation threshold temperature of about 300° C. When the fibrous carbon precursor is removed by oxidation and the coating is subjected to a heat treatment to adjust its electrical characteristics, this heat treatment may be effected before or after the carbon precursor is removed, or simultaneously with removal. The coating of the fibrous carbon precursor 200 may be performed in the apparatus of FIG. 6 using, for example gases containing silicon and carbon, e.g. a silane/ethylene mixture, as the reactant gases to deposit a coating containing silicon and carbon on the fibrous carbon element 200. Phosphine gas may be used as a dopant together with the silane/ethylene if desired to assist in modifying the coating's electrical conductivity by co-depositing phosphorus with silicon and carbon in the coating. Other suitable dopants may be aluminium, or boron, or arsenic, or nitrogen, or oxygen, the purpose of the dopant being to increase the electrical conductivity of the deposited material by providing an electron donor or acceptor material, so that the final desired electrical resistivity of the heating element can be obtained at lower heat treatment temperatures than would otherwise be required. The heat treatment of the coating to modify its electrical resistivity is normally carried out at 800°-1400° C. to achieve a particular resistivity of the deposited coating at a selected temperature. In many instances the use of phosphine gas as a dopant allows the heat treatment temperture to achieve a particular coating resistivity to be reduced to about 600°-1100° C. An Example of the production of such a heating element by the PAVD process is as allows, the sequence of operations performed being indicated diagrammatically in FIG. 7:

EXAMPLE I

Heating Element Containing phosphorus-doped Silicon Carbide

Typical fabrication procedure parameters used are given below:

|  | Range | Example I |
|---|---|---|
| Fibrous Carbon Element Precursor | | |
| Carbonization temperature: | 600–1800° C. | 725° C. |
| Precursor Geometry | | |
| Length: | 5–1000 mm | 120 mm |
| Outside Diameter: | 5–500 mm | 44 mm |
| Inside Diameter: | 1–499 mm | 35 mm |
| Density: | 50–750 kg/m3 | 70.2 kg |
| PAVD Coating Conditions | | |
| Gas Compositons | | |
| Argon | 100% | 100% |
| Silane/Ethylene | 1/99% to 99/1% | 50/50% |
| Phosphine/Argon | 0.1/100%–10/100% | 2/98% |
| Gas Flow Rates: ml/min | | |
| Argon | 10–500 | 250 |
| Silane/Ethylene | 1–500 | 45.6 |
| Phosphine/Argon | 1–100 | 10 |
| Coating Gas Pressure: Torr | $10^1$–100 | 0.9 |
| R.F. Conditions (kv) | 1–5 | 3.5 |
| Heat Treatment Conditions | | |
| Oxidation Temperature (°C.) | | 800 |
| Time (hours) | | 16 |
| Subsequent Heat Treatment Temperature (°C.) | | None |
| Time (hours) | | |
| Electrical Properties After Heat Treatment (Heating Element) | | |
| Temperature (°C) | | 50° C. |
| Resistance at temperature (Ohms) | | 37.2 |
| Resistance ratio * (R20/R200) | | 3.90 |

$$\left( R20/R200 = \frac{\text{Electrical Resistance at 20° C.}}{\text{Electrical Resistance at 200° C.}} \right)$$

| | |
|---|---|
| Power generated at 241.5° C. (kw) | 5.6 |
| Voltage (volts) | 211.3 |
| Element length (mm) | 14.6 |

The fibrous carbon precursor is placed in the tube 202 of FIG. 6, and the tube 202 subsequently evacuated down to a vacuum pressure of about $10^{-2}$ Torr. Argon is admitted through the gas supply line 220 to a vacuum pressure inside the tube 202 of about 1.0 Torr. The high frequency generator 238 is subsequently energised, and after about one hour, the silane/ethylene mixture to deposit the silicon and carbon is introduced into tube 202 through the gas supply line 222, and a mixture of phosphine/argon is introduced into the tube 202 through the gas supply line 224, the vacuum pressure inside the tube 202 being maintained at about 0.9 Torr. After a suitable time interval (e.g. 48 hours) depending on the thickness of coating required (typically 0.8 grammes/hour are deposited), the valves 221, 223 and 225 are closed, the tube 202 evacuated to about $10^{-2}$ Torr and the high frequency generator 238 switched off to allow the coated precursor to cool under vacuum conditions. The coated precursor is subsequently removed from the tube 202 and cut into appropriate lengths prior to oxidation to remove the fibrous carbon precursor and such further heat treatment as may be required to modify the electrical resistivity of the coating.

An oxidation process to remove the fibrous carbon precursor may be carried out at any convenient temperature above about 300° C., but the time taken to oxidise the carbon can be reduced by increasing the oxidation temperature. Too high an oxidation temperature may however have an effect on the electrical properties of the coating which is not desired, and this possibility arises as a result of the nature of the material deposited during the PAVD coating process.

The as deposited material in Example I essentially consists of free carbon, free silicon, carbon combined chemically with silicon as silicon carbide, and a relatively small amount of phosphorus. Heat treatment of this material changes the electrical properties of the coating to a degree which is influenced by the heat treatment temperature and time. Thus it is possible to either heat treat in an inert atmosphere at a relatively high temperature to obtain a selected resistivity, and to follow this by oxidation at a lower temperature, or to oxidise at a relatively low temperature and to follow this process with one or more heat treatment stages in an inert or oxidising atmosphere to adjust the coating restivity to the desired value. In some cases depending on the PAVD coating process parameters employed it will be possible to carry out a one stage heat treatment process which both removes the fibrous carbon precursor by oxidation and adjusts the resistivity of the coating to a desired value. Oxidation removes not only the carbon precursor but also may remove some or all of the elemental carbon in the coating. Consequently the final coating resistivity depends not only on the temperature and time of the heat treatment but also on whether or not the oxidation stage is carried out first. Additionally some of the free silicon may become oxidised if the oxidation temperature is very high.

The heat treatment time and temperature to produce a required coating resitivity is not a unique process, and depends not only on the PAVD coating parameters, for example the gas composition and flow rates and RF conditions, but also on the electrical properties of the carbon precursor on which the coating is deposited. The electrical resistivity of the fibrous carbon precursor during the coating process is a function not only of the carbonisation temperature of the carbon precursor but also of the RF field conditions through its effect on the temperature of the carbon precursor during the coating process. It has been found that the composition of the material deposited during the coating process and its electrical properties is influenced by both the RF field voltage and the carbonisation temperature to which the carbon precursor was subjected, and that the heat treatment procedure required to obtain a particular electrical resistivity of the deposited material depends on its composition. Consequently some combinations of PAVD parameters and carbon precursor carbonisation temperatures can allow a given resistivity of the deposited material to be obtained together with a low temperature coefficient of resistance of the deposited material after heat treatment, whereas others may not. Furthermore the use of a dopant such as phosphorus in the PAVD coating process changes the relationship between resistivity, heat treatment conditions, and temperature coefficient of resistance.

Removing the phosphorus from the coating gases and substituting arsenic or boron for phosphorus also changes the composition of the material deposited and effects the heat treatment process required to attain a particular resistivity. Properties of heating elements made in a way similar to that outlined in Example I but with or without a dopant are described in the following Examples II and III.

EXAMPLE II

Heating Element Containing Undoped Silicon Carbide

| Fibrous Carbon Element Precursor | |
|---|---|
| As in Example I: Elements carbonised at 725° C. Density | 103 kg/m³ |
| PAVD Coating Conditions | |
| Gas Composition | |
| Argon | 100% |
| Silane/Ethylene | 60/40% |
| Dopant | None |
| Gas Flow Rates: ml/min | |
| Argon | 252 |
| Silane/Ethylene | 40 |
| Dopant | None |
| Coating Gas Pressure: Torr | 0.9 |
| RF Conditions: kv | 3.5 |
| Heat Treatment Conditions | |
| Oxidation temperature (°C.) | 800 |
| Time (hours) | 16 |
| Subsequent heat treatment (°C.) | 1385 |
| Time (hours) | 3 |
| Electrical Properties After Heat Treatment (Heating Element) | |
| Temperature (°C.) | 50 |
| Resistance at temperature (Ohms) | 41.8 |
| Resistance ratio (R20/R200) | 3.84 |
| Power generated at 254° C. (kw) | 5.74 |
| Voltage (volts) | 224.4 |
| Element length (mm) | 14.6 |

EXAMPLE III:

Heating Element Containing Arsenic Doped Silicon Carbide

| Fibrous Carbon Precursor | |
|---|---|
| As in Example I: Element carbonised at 1000° C. Density | 106 kg/m³ |
| PAVD Coating Conditions | |
| Gas Composition | |
| Argon | 100% |
| Silane/Ethylene: | 50/50% |
| Dopant: | 2% Arsine/98% Argon |
| Gas Flow Rates: ml/min | |
| Argon: | 50 |
| Silane/Ethylene: | 70.6 |
| Dopant: | 7.0 |
| Coating Gas Pressure: Torr | 0.9 |
| RF Conditions: (kv) | 3.5 |
| Heat Treatment Conditions | |
| Oxidation temperature (°C.) | 800 |
| Time (hours) | 16 |
| Subsequent heat Treatment (°C.) | None |
| Time (hours) | |
| Electrical Properties After Heat Treatment (Heating Element) | |
| Temperature (°C.) | 50 |
| Resistance at temperature (Ohms) | 18.1 |
| Resistance ratio (R20/R200) | 2.9 |
| Power generated at 233.5° C. (kw) | 2.47 |
| Voltage (volts) | 121.6 |
| Element length (mm) | 14.4 |

The method of Example I may also be used to produce a coating which contains silicon but not to a substantial extent, if at all, silicon carbide. This is achieved by substituting silane for the mixture of silane and ethylene in Example 1. Such coatings may also be doped, for example with phosphorus, arsenic, boron, nitrogen, or oxygen, or be undoped. Example IV illustrates such a silicon element doped with nitrogen.

EXAMPLE IV

Heating Element Containing Nitrogen-Doped Silicon

| Fibrous Carbon Precursor | |
|---|---|
| As in Example I: Element carbonised at 725° C. Density | 53.5 kg/m³ |
| PAVD Coating Conditions | |
| Gas Composition | |
| Argon | 100% |
| Silane | 100% |
| Dopant: N₂ | 100% |
| Gas Flow Rates: ml/min | |
| Argon: | 214 |
| Silane | 20.7 |
| Dopant | 19.9 |
| Coating Gas Pressure: Torr | 0.9 |
| RF: kv | 3.5 |
| Heat Treatment Conditions | |
| Oxidation temperature (°C.) | 800 |
| Time (hours) | 16 |
| Subsequent heat treatment (°C.) | None |
| Time (hours) | |
| Electrical Properties After Heat Treatment (Heating Element) | |
| Temperature (°C.) | 247 |
| Resistance at temperature (Ohms) | 28.8 |
| Resistance ratio (R20/R200) | 1.55 |
| Power generated at 247° C. (kw) | 1.79 |
| Voltage (volts) | 227 |
| Element length | 14.2 |

As a general rule increasing the time and the temperature of heat treatment of the coating up to a heat treatment temperature of about 1400° C., reduces the electrical resistivity of the coating provided material is not lost by evaporation.

When the heating element is to be used over a relatively wide temperature range (e.g. 20° C. to 200° C.), the temperature coefficient of electrical resistance (TCR) of the heating element may become of importance. Examples V and VI illustrate the variation in TCR values arising from different precursor and process conditions.

EXAMPLE V

Heating Element Containing Undoped Silicon Carbide

| Fibrous Carbon Precursor | |
|---|---|
| As in Example I: Element carbonised at 650° C. Density | 150 kg/m³ |
| PAVD Coating Conditions | |
| Gas Composition | |
| Argon | 100% |
| Silane/Ethylene | 60/40% |
| Dopant | None |
| Gas Flow Rates: ml/min | |
| Argon | 250 |
| Silane/Ethylene | 40 |
| Dopant | None |
| Coating Gas Pressure: Torr | 0.9 |
| RF: kv | 3.8 |
| Heat Treatment Conditions | |
| Oxidation temperature (°C.) | 800 |
| Time (hours) | 16 |
| Subsequent heat treatment (°C.) | 1150 |
| Time (hours) | 3 |
| Electrical Properties After Heat Treatment (Heating Element) | |
| Temperature (°C.) | 258.5 |
| Resistance at temperature (Ohms) | 3.12 |
| Resistance ratio (R20/R200) | 1.93 |
| Power generated at 258° C. (kw) | 6.11 |
| Voltage (volts) | 138 |
| Element length (mm) | 12.3 |
| Example VI: Heating Element Containing Undoped Silicon Carbide | |
| Fibrous Carbon Precursor | |
| As in Example I: Element carbonised at 725° C. Density | 130 kg/m³ |
| PAVD Coating Conditions | |
| Gas Composition | |
| Argon | |
| Silane/Ethylene | 60/40% |
| Dopant | None |
| Gas Flow Rates ml/min | |
| Argon | 250 |
| Silane/Ethylene | 40 |
| Dopant | None |
| Coating Gas Pressure: Torr | 0.9 |
| RF: kv | 3.5 |
| Heat Treatment Conditions | |
| Oxidation temperature (°C.) | 800 |
| Time (hours) | 16 |
| Subsequent heat treatment (2-stage) (°C.) | 1300→1385 |
| Time (hours) | 3   3 |
| Electrical Properties After Heat Treatment | |
| Temperature (°C.) | 256 |
| Resistance at temperature (Ohms) | 3.04 |
| Resistance Ratio (R20/R200) | 2.96 |
| Power generated (kw) | 7.51 |
| Voltage (volts) | 151 |
| Element length (mm) | 15.0 |

Comparison of Examples V and VI gives the following:-

| Example V | | Example VI | |
|---|---|---|---|
| Resistance Ratio | Heat Treatment °C. | Resistance Ratio | Heat Treatment °C. |
| 1.93 | 1150 | 2.96 | 1300/1385 |

In Example V the resistance ratio is lower than in Example VI in spite of the fact that the heat treatment was carried out at a lower temperature than was used for Example VI. This illustrates the significant effect of substrate carbonisation temperature and kv since it has also been found that the resistance ratio normally falls as the heat treatment temperature is increased and on this basis alone the resistance ratio of Example VI would be expected to be lower than the value established by Example V. Selection of substrate carbonisation temperature and kv is therefore one way of obtaining a desired value of the resistance ratio R20/R200.

By way of comparison, a silicon carbide heating element made by carbonixation at 1700° C. of a fibrous carbon precursor, coating of the precursor, and subsequent heat treatment of the coated precursor at 1385° C., was found to have a resistance ratio (R20/R200) of 8.49, whereas a precursor carbonised at 650° C. and the coated precursor heat treated at 1185° C. was found to have a resistance ratio (R20/R200) of 1.48. Thus by appropriate selection of the carbonisation temperature, the coating conditions and the heat treatment temperature, heating elements having a required electrical resistivity and TCR may be made.

Although the coating of the fibrous carbon has been described in relation to PAVD, it will be understood that appropriate alternative coating processes may be used.

The permeable electric heating elements may be of alternative shapes or sizes to those aforedescribed, and it will be understood that the heat transfer system in the aforedescribed aspects may be used in alternative applications, for example where the heat transfer fluid comprises a gas. Furthermore, the aforedescribed permeable electric heating elements may be used in alternative applications to heat a fluid.

It will be understood that where the carbon fibers in the fibrous carbon precursor are contiguous, the coatings about the fibers may merge together at these positions of contiguity. Hence when the coated precursor is oxidised, the tubular fibers that remain may be integral with closely adjacent tubular fibers at the positions of contiguity. Otherwise the coating material deposited substantially replicates the geometry and fiber distribution pattern of the original fibrous carbon precursor.

If desired, coatings of alternative materials to those aforedescribed may be deposited in the PAVD apparatus of FIG. 6, not necessarily silicon-containing coatings, depending on the application to which the heating elements are to be put. Coatings may also be applied in the PAVD apparatus of FIG. 6 on precursors for alternative applications, the coating being subjected to subsequent heat treatment to provide a desired electrical resistivity of the coating.

We claim:

1. A process for manufacturing a fluid permeable, fibrous electric heating element comprising an electrically conductive selected material, the process comprising the steps of, forming a precursor comprising carbon fibers, coating the fibers of the precursor with the selected material by a vapor deposition process, and then heating the coated precursor in an oxidizing environment at a temperature between 300° C. and 1400° C. such as to remove the fibrous carbon precursor by oxidation thereof and leave a fibrous body comprising hollow tubular fibers comprising the selected material, said tubular fibers defining a voidage between adjacent said tubular fibers in the body, and the voidage providing a path for a fluid to be heated, and heating the coated precursor at a temperature between 650° C. and 1400° C. to modify the structure of the coating and to lower the electrical resistivity of the coating to a desired value, the two heating steps being performed in either order or as a single step.

2. A process as claimed in claim 1 wherein said selected material is a silicon-containing material.

3. A process as claimed in claim 1 wherein the selected material includes at least one material selected from the group consisting of: silicon, silicon carbide, and silicon nitride.

4. A fluid permeable, fibrous electric heating element made by the method claimed in claim 3.

5. A process as claimed in claim 3 wherein the selected material additionally includes at least one material selected from the group consisting of: carbon, phosphorus, arsenic, aluminum, boron, nitrogen or oxygen.

6. A fluid permeable, fibrous electric heating element made by the method claimed in claim 5.

7. A process for manufacturing a fluid permeable fibrous electric heating element, the process comprising the steps of,
(a) carbonising a fibrous acrylic body at a temperature of about 650° C. to form a fibrous carbon precursor;
(b) placing the fibrous carbon precursor in a plasma activated vapour deposition apparatus and evacuating the apparatus to a pressure of about 0.9 Torr;
(c) admitting into the apparatus a coating gas comprising a silane and ethylene in proportions of about 60% Silane/40% ethylene, and a gas comprising Argon;
(d) applying an anode voltage of about 3.8 kv to the apparatus whilst maintaining a pressure of about 0.9 Torr in the apparatus;
(e) removing the coated precursor from the apparatus, and heating the coated carbon precursor in an oxidising environment at a temperature of about 800° C. to remove the carbon precursor by oxidation thereof, and
(f) heating the coated precursor at a temperature in the range 800° C.–1400° C. to modify the structure of the coating and provide a desired electrical resistivity thereof.

* * * * *